(12) United States Patent
Yeh et al.

(10) Patent No.: US 11,004,952 B1
(45) Date of Patent: May 11, 2021

(54) HIGH-ELECTRON MOBILITY TRANSISTOR AND FABRICATION METHOD THEREOF

(71) Applicant: UNITED MICROELECTRONICS CORP., Hsin-Chu (TW)

(72) Inventors: Chih-Tung Yeh, Taoyuan (TW); Shin-Chuan Huang, Tainan (TW); Chun-Ming Chang, Kaohsiung (TW); Bo-Rong Chen, Hsinchu County (TW); Wen-Jung Liao, Hsinchu (TW); Chun-Liang Hou, Hsinchu County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 16/699,706

(22) Filed: Dec. 1, 2019

(30) Foreign Application Priority Data

Nov. 5, 2019 (TW) ................................ 108140080

(51) Int. Cl.
| | | |
|---|---|---|
| *H01L 29/66* | (2006.01) | |
| *H01L 29/778* | (2006.01) | |
| *H01L 21/02* | (2006.01) | |
| *H01L 29/40* | (2006.01) | |
| *H01L 29/20* | (2006.01) | |

(52) U.S. Cl.
CPC .... *H01L 29/66462* (2013.01); *H01L 21/0254* (2013.01); *H01L 21/02381* (2013.01); *H01L 29/2003* (2013.01); *H01L 29/402* (2013.01); *H01L 29/7786* (2013.01)

(58) Field of Classification Search
CPC ......... H01L 29/66462; H01L 21/02381; H01L 21/0254; H01L 29/2003; H01L 29/402; H01L 29/7786
See application file for complete search history.

(56) References Cited

U.S. PATENT DOCUMENTS

| | | | |
|---|---|---|---|
| 7,812,369 B2 | 10/2010 | Chini | |
| 9,520,491 B2* | 12/2016 | Chowdhury | .......... H01L 23/291 |
| 9,553,182 B2 | 1/2017 | Yu | |
| 9,755,027 B2* | 9/2017 | Lee | ........................ H01L 29/402 |
| 2010/0244018 A1* | 9/2010 | Kaneko | ............... H01L 29/7786 |
| | | | 257/43 |

(Continued)

FOREIGN PATENT DOCUMENTS

TW    I528549    4/2016

OTHER PUBLICATIONS

Wong, "Novel Asymmetric Slant Field Plate Technology for High-Speed Low-Dynamic Ron E/D-mode GaN HEMTs", Jan. 2017.

*Primary Examiner* — Douglas W Owens
(74) *Attorney, Agent, or Firm* — Winston Hsu

(57) ABSTRACT

A high-electron mobility transistor includes a substrate; a buffer layer on the substrate; a AlGaN layer on the buffer layer; a passivation layer on the AlGaN layer; a source region and a drain region on the AlGaN layer; a source layer and a drain layer on the AlGaN layer within the source region and the drain region, respectively; a gate on the AlGaN layer between the source region and a drain region; and a field plate on the gate and the passivation layer. The field plate includes an extension portion that laterally extends to an area between the gate and the drain region. The extension portion has a wave-shaped bottom surface.

14 Claims, 3 Drawing Sheets

(56) References Cited

U.S. PATENT DOCUMENTS

| | | | |
|---|---|---|---|
| 2014/0264369 A1* | 9/2014 | Padmanabhan | H01L 29/7787 257/76 |
| 2014/0264431 A1* | 9/2014 | Lal | H01L 21/8252 257/121 |
| 2017/0062581 A1 | 3/2017 | You | |
| 2017/0133496 A1 | 5/2017 | Tsai | |

* cited by examiner

US 11,004,952 B1

HIGH-ELECTRON MOBILITY TRANSISTOR AND FABRICATION METHOD THEREOF

BACKGROUND OF THE INVENTION

1. Field of the Invention

The present invention relates to the field of semiconductor technology, and more particularly to a gallium nitride (GaN) high electron mobility transistor (HEMT) and a method for fabricating the same.

2. Description of the Prior Art

High electron mobility transistors (HEMTs) are widely used in high-frequency, high-power amplifier components due to high breakdown voltage, high saturation electron moving speed and high operation temperature.

In a typical HEMT, for example, a two-dimensional electron gas (2DEG) is generated at a semiconductor heterojunction. The 2DEG represents a very thin conduction layer of highly mobile and highly concentrated charge carriers free to move readily in the two dimensions of that conduction layer, but constrained from movement in a third dimension perpendicular to the conduction layer.

GaN HEMTs are attractive for high speed, high voltage circuits because of their high breakdown field, high electron mobility, and high electron velocity. However, at high drain bias, GaN HEMTs suffer from dynamic on-resistance (Ron) degradation, reducing transistor efficiency during switching.

There is a need to overcome the drawbacks and deficiencies in the art by providing a HEMT exhibiting high breakdown voltage and improved dynamic Ron.

SUMMARY OF THE INVENTION

One object of the present invention is to provide a high electron mobility transistor (HEMT) having high breakdown voltage and improved dynamic Ron to overcome the disadvantages and deficiencies of the prior art.

One aspect of the invention provides a high-electron mobility transistor, comprising a substrate; a buffer layer on the substrate; a AlGaN layer on the buffer layer; a passivation layer on the AlGaN layer; a source region and a drain region on the AlGaN layer; a source layer and a drain layer on the AlGaN layer within the source region and the drain region, respectively; a gate on the AlGaN layer between the source region and a drain region; and a field plate on the gate and the passivation layer. The field plate comprises an extension portion that laterally extends to an area between the gate and the drain region. The extension portion has a wave-shaped bottom surface.

According to some embodiments, the wave-shaped bottom surface is comprised of a plurality of hemispherical features.

According to some embodiments, the plurality of hemispherical features is in direct contact with the passivation layer between the gate and the drain region.

According to some embodiments, the buffer layer comprises GaN layer.

According to some embodiments, the passivation layer comprises silicon nitride or aluminum oxide.

According to some embodiments, the wave-shaped bottom surface comprises a plurality of curved surfaces facing downward to the AlGaN layer.

According to some embodiments, the plurality of curved surfaces is in direct contact with the passivation layer.

According to some embodiments, the field plate is in direct contact with the gate.

Another aspect of the invention provides a method for forming a high-electron mobility transistor. A substrate is provided. A buffer layer is formed on the substrate. An AlGaN layer is formed on the buffer layer. A passivation layer is formed on the AlGaN layer. A source layer and a drain layer are formed on the AlGaN layer within a source region and a drain region, respectively. A gate is then formed on the AlGaN layer between the source region and a drain region. A field plate is formed on the gate and the passivation layer. The field plate comprises an extension portion that laterally extends to an area between the gate and the drain region. The extension portion has a wave-shaped bottom surface.

According to some embodiments, the wave-shaped bottom surface is comprised of a plurality of hemispherical features.

According to some embodiments, the plurality of hemispherical features is in direct contact with the passivation layer between the gate and the drain region.

According to some embodiments, the buffer layer comprises GaN layer.

According to some embodiments, the passivation layer comprises silicon nitride or aluminum oxide.

According to some embodiments, the wave-shaped bottom surface comprises a plurality of curved surfaces facing downward to the AlGaN layer.

According to some embodiments, the plurality of curved surfaces is in direct contact with the passivation layer.

According to some embodiments, the field plate is in direct contact with the gate.

These and other objectives of the present invention will no doubt become obvious to those of ordinary skill in the art after reading the following detailed description of the preferred embodiment that is illustrated in the various figures and drawings.

DETAILED DESCRIPTION

In the following detailed description of the disclosure, reference is made to the accompanying drawings, which form a part hereof, and in which is shown, by way of illustration, specific embodiments in which the invention may be practiced. These embodiments are described in sufficient detail to enable those skilled in the art to practice the invention.

Other embodiments may be utilized and structural, logical, and electrical changes may be made without departing from the scope of the present invention. Therefore, the following detailed description is not to be considered as limiting, but the embodiments included herein are defined by the scope of the accompanying claims.

Figure 1:
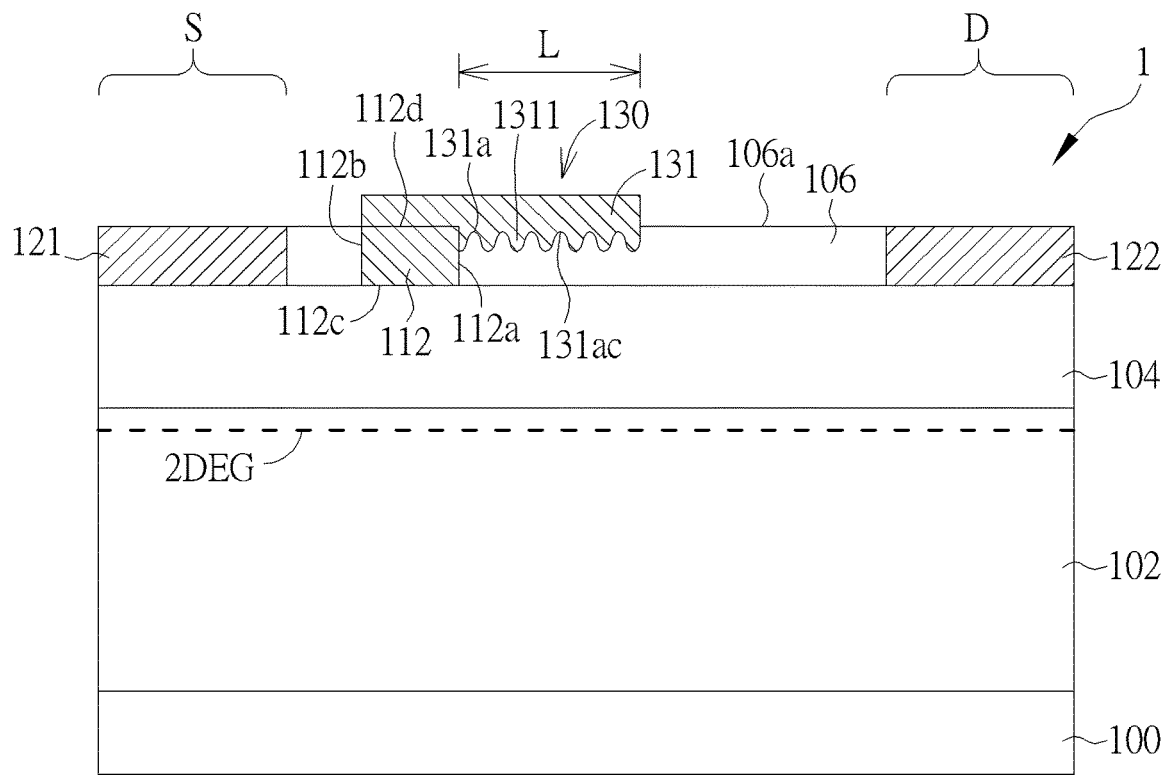
FIG. 1 is a cross-sectional view of a high electron mobility transistor according to an embodiment of the invention.

Please refer to FIG. 1, which is a cross-sectional view of a high electron mobility transistor (HEMT) according to an embodiment of the invention. As shown in FIG. 1, the HEMT 1 comprises a substrate 100 and a buffer layer 102 disposed on the substrate 100, an aluminum gallium nitride (AlGaN) layer 104 disposed on the buffer layer 102, and a passivation layer 106 is disposed on the AlGaN layer 104. For example, the passivation layer 106 may include silicon nitride, aluminum oxide or the like, but is not limited thereto. For example, the passivation layer 106 may have a thickness of about 2000 angstroms, but is not limited thereto. For example, the buffer layer 102 can comprise a gallium nitride (GaN) layer. For example, the buffer layer 102 may be a single layer or a multilayer structure. For example, the substrate 100 may be a conductive substrate. For example, the substrate 100 may be a silicon substrate, but is not limited thereto. At the interface between the AlGaN layer 104 and the buffer layer 102, a two-dimensional electron cloud 2DEG may be formed.

In accordance with an embodiment of the invention, a source region S and a drain region D are defined on the AlGaN layer 104. A source layer 121 and a drain layer 122 are respectively disposed in the source region S and the drain region D on the AlGaN layer 104. For example, the source layer 121 and the drain layer 122 may include a metal such as titanium, aluminum, copper, or an alloy thereof, but is not limited thereto. A gate 112 may be disposed between the source region S and the drain region D on the AlGaN layer 104. For example, the gate 112 may include a metal such as titanium nitride, but is not limited thereto.

According to an embodiment of the invention, the gate 112 may include two opposite sidewall 112a and sidewall 112b, wherein the sidewall 112a is closer to the drain region D, and the sidewall 112b is closer to the source region. S. The distance from the sidewall 112a to the drain region D is generally greater than the distance from the sidewall 112b to the source region S. For example, the distance from the side wall 112a to the drain region D is about 17 micrometers, and the distance from the side wall 112b to the source region S is about 3 micrometers, but is not limited thereto.

According to an embodiment of the invention, the gate 112 may include a bottom surface 112c and a top surface 112d, wherein the bottom surface 112c is in direct contact with the AlGaN layer 104, and the top surface 112d may be flush with the top surface 106a of the passivation layer 106.

According to an embodiment of the invention, a field plate 130 is further disposed on the gate 112 and the passivation layer 106, wherein the field plate 130 may comprise titanium nitride, aluminum-copper alloy or a combination thereof. The field plate 130 directly contacts the top surface 112d of the gate 112. According to an embodiment of the invention, the HEMT 1 has only a single and continuous monolithic field plate 130. According to an embodiment of the invention, the field plate 130 includes an extension portion 131 extending laterally to a region between the gate 112 and the drain region D, wherein the extension portion 131 has a wave-shaped bottom surface 131a. The distance L from the sidewall 112a to the drain region D is less than about one third of the distance from the sidewall 112a to the drain region D, but is not limited thereto.

According to an embodiment of the invention, the wave-shaped bottom surface 131a comprises a plurality of hemispherical features 1311, and the plurality of hemispherical features 1311 directly contact the passivation layer 106 between the gate 112 and the drain region D. In FIG. 1, the plurality of hemispherical features 1311 extend into the top surface 106a of the passivation layer 106. According to an embodiment of the invention, the wave-shaped bottom surface 131a includes a plurality of curved surfaces 131ac that faces downward the AlGaN layer 104. The plurality of curved surfaces 13 lac is in direct contact with the passivation layer 106.

A feature of the present invention is that the HEMT 1 has a single field plate 130 that directly contacts the gate 112. The extension portion 131 of the field plate 130 has a wave-shaped bottom surface 131a. The wave-shaped bottom surface 131a includes a plurality of hemispherical features 1311 that directly contact the passivation layer 106 between the gate 112 and the drain region D. Such structural features can alleviate the channel electric field, thereby increasing the breakdown voltage of the HEMT 1 during operation. In addition, the above structural features can also improve the dynamic Ron.

Please refer to FIG. 2 to FIG. 5, which are schematic diagrams showing a method for fabricating a high electron mobility transistor according to an embodiment of the invention. The same components, layers, area or material are denoted by the same reference numerals.

Figure 2:
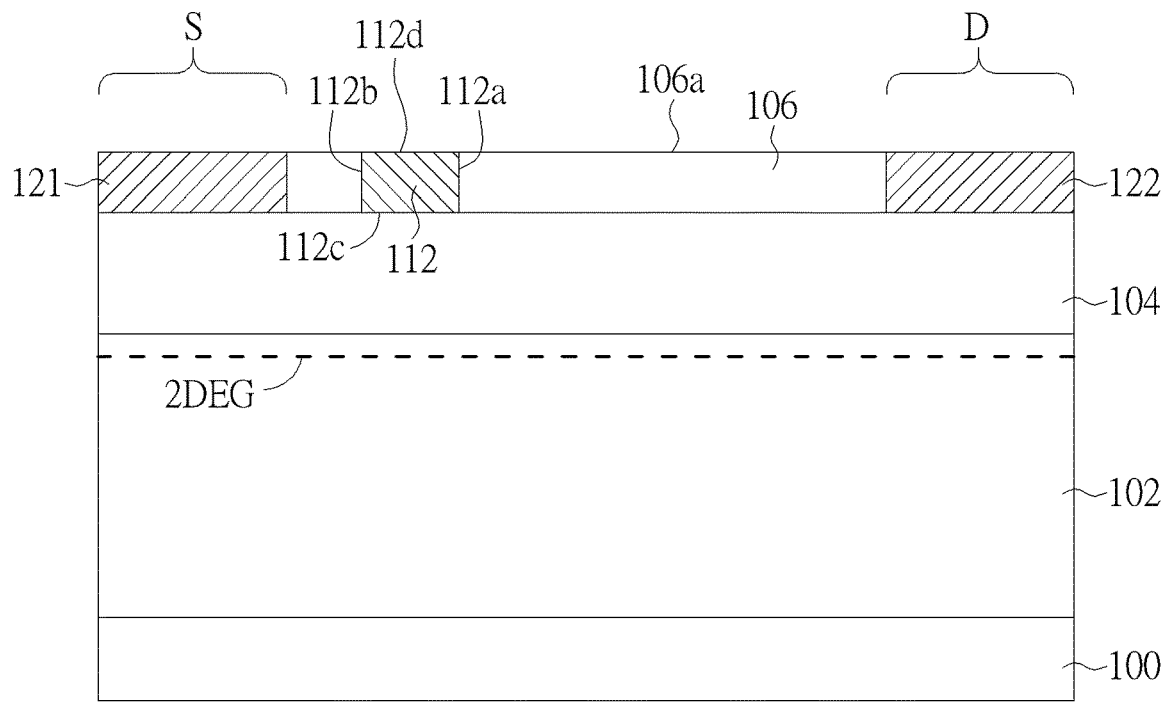
FIG. 2 to FIG. 5 are schematic diagrams showing a method for fabricating a high electron mobility transistor according to an embodiment of the invention.

As shown in FIG. 2, a substrate 100, such as a silicon substrate, is provided. Next, the buffer layer 102, the AlGaN layer 104, and the passivation layer 106 are formed in an epitaxial manner on the surface of the substrate 100 in sequence. For example, the passivation layer 106 may include silicon nitride, aluminum oxide or the like, but is not limited thereto. For example, the passivation layer 106 may have a thickness of about 2000 angstroms, but is not limited thereto. For example, the buffer layer 102 can comprise a GaN layer. For example, the buffer layer 102 may be a single layer or a multilayer structure. For example, the substrate 100 can be a conductive substrate. For example, the substrate 100 may be a silicon substrate, but is not limited thereto.

Subsequently, a source region S and a drain region D are formed on the AlGaN layer 104, and a source layer 121 and a drain layer 122 are formed in the source region S and the drain region D, respectively. For example, the source layer 121 and the drain layer 122 may include a metal such as titanium, aluminum, copper, or an alloy thereof, but is not limited thereto.

A gate 112 is then formed between the source region S and the drain region D on the AlGaN layer 104. For example, the gate 112 may include a metal such as titanium nitride, but is not limited thereto.

According to an embodiment of the invention, the gate 112 may include two opposite sidewalls 112a and sidewalls 112b, wherein the sidewall 112a is closer to the drain region D, and the sidewall 112b is closer to the source region S. The distance from the sidewall 112a to the drain region D is generally greater than the distance from the sidewall 112b to the source region S. For example, the distance from the sidewall 112a to the drain region D is about 17 micrometers, and the distance from the sidewall 112b to the source region S is about 3 micrometers, but is not limited thereto.

According to an embodiment of the invention, the gate 112 may include a bottom surface 112c and a top surface 112d, wherein the bottom surface 112c is in direct contact with the AlGaN layer 104, and the top surface 112d may be flush with the top surface 106a of the passivation layer 106.

Figure 3:
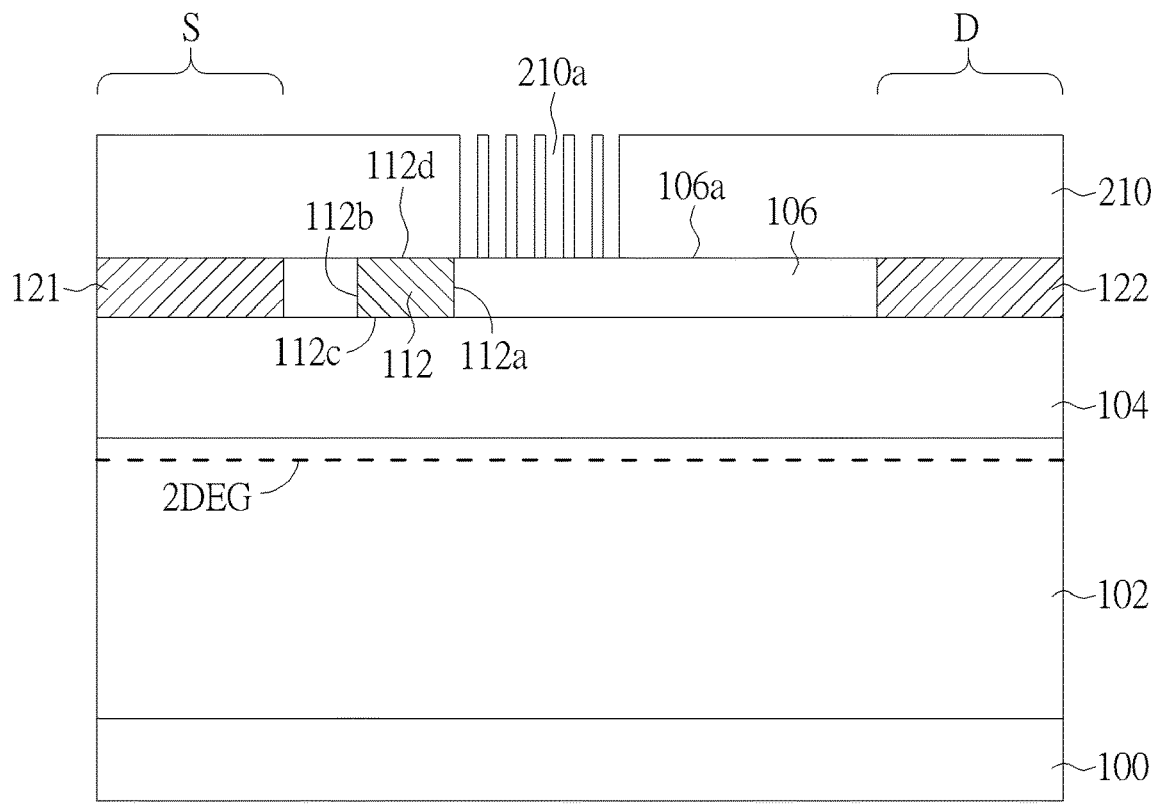

As shown in FIG. 3, a patterned photoresist layer 210 is formed on the passivation layer 106. The patterned photoresist layer 210 covers the top surface 106a of the passivation layer 106, the source region S, the drain region D, and the top surface 112d of the gate 112. According to an embodiment of the invention, the patterned photoresist layer 210 includes a plurality of openings 210a that partially expose the top surface 106a of the portion of passivation layer 106 between the sidewall 112a and the drain region D.

Figure 4:
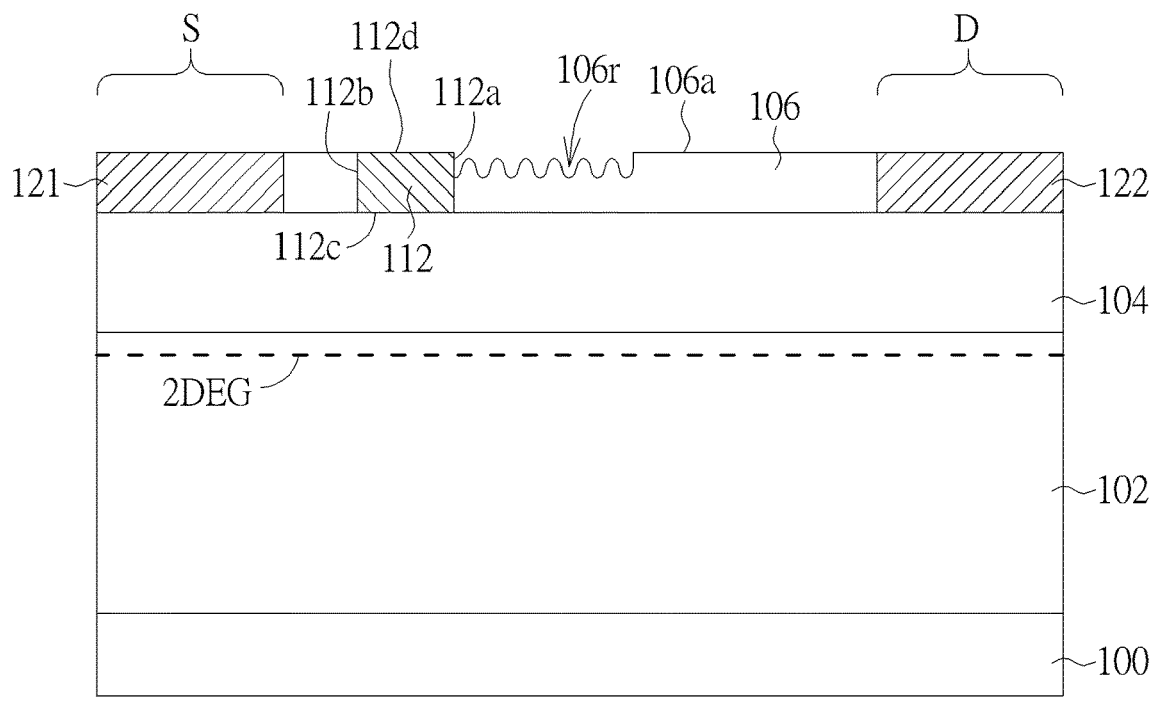

As shown in FIG. 4, an etching process such as a wet etch and/or a dry etch process is performed. The dry etch process can utilize fluorine- or chlorine-containing gas to etch the top surface 106a of the exposed passivation layer 106 through the plurality of openings 210a of the patterned photoresist layer 210, thereby forming a plurality of recessed structures 106r on the top surface 106a of the passivation layer 106.

Figure 5:
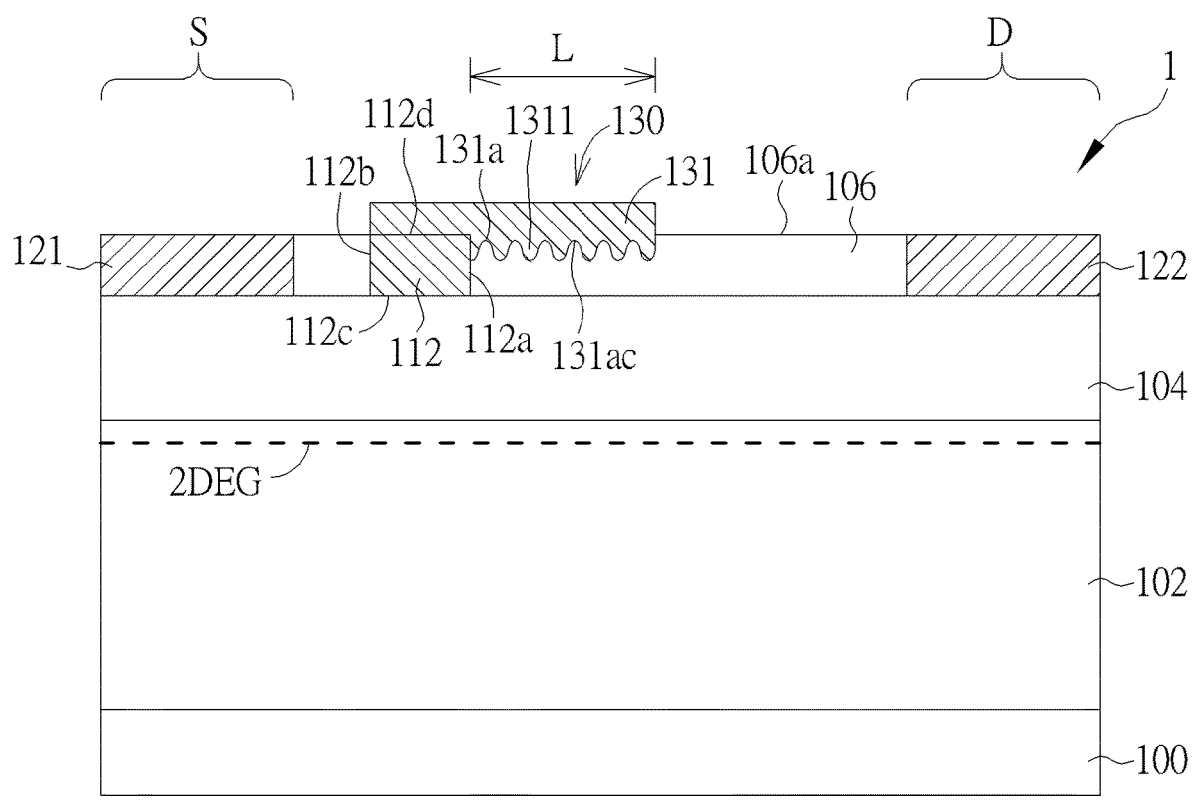

Finally, as shown in FIG. 5, a field plate 130 is formed on the gate 112 and the passivation layer 106. The field plate 130 includes an extension portion 131 extending laterally to the region between the gate 112 and the drain region D. The extension portion 131 has a wave-shaped bottom surface 131a formed on the plurality of recessed structures 106r of the top surface 106a of the passivation layer 106.

According to an embodiment of the invention, the field plate 130 may comprise titanium nitride, an aluminum copper alloy, or a combination thereof. The field plate 130 directly contacts the top surface 112d of the gate 112. According to an embodiment of the invention, the field plate 130 is a single and continuous monolithic field plate 130. According to the embodiment of the present invention, the distance L of the extending portion 131 extending from the sidewall 112a toward the drain region D is less than about one third of the distance from the sidewall 112a to the drain region D, but not limited to thereto.

According to an embodiment of the invention, the wave-shaped bottom surface 131a comprises a plurality of hemispherical features 1311, and the plurality of hemispherical features 1311 directly contacts the passivation layer 106 between the gate 112 and the drain region D. The plurality of hemispherical features 1311 are recessed within the top surface 106a of the passivation layer 106. According to an embodiment of the invention, the wave-shaped bottom surface 131a includes a plurality of curved surfaces 13 lac facing downward to the AlGaN layer 104. The plurality of curved surfaces 13 lac are in direct contact with the passivation layer 106.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A high-electron mobility transistor, comprising:
   a substrate;
   a buffer layer on the substrate;
   a AlGaN layer on the buffer layer;
   a passivation layer on the AlGaN layer;
   a source region and a drain region on the AlGaN layer;
   a source layer and a drain layer on the AlGaN layer within the source region and the drain region, respectively;
   a gate on the AlGaN layer between the source region and a drain region; and
   a field plate on the gate and the passivation layer, wherein the field plate comprises an extension portion that laterally extends to an area between the gate and the drain region, and wherein the extension portion has a wave-shaped bottom surface, wherein the wave-shaped bottom surface is comprised of a plurality of hemispherical features.

2. The high-electron mobility transistor according to claim 1, wherein the plurality of hemispherical features is in direct contact with the passivation layer between the gate and the drain region.

3. The high-electron mobility transistor according to claim 1, wherein the buffer layer comprises GaN layer.

4. The high-electron mobility transistor according to claim 1, wherein the passivation layer comprises silicon nitride or aluminum oxide.

5. The high-electron mobility transistor according to claim 1, wherein the wave-shaped bottom surface comprises a plurality of curved surfaces facing downward to the AlGaN layer.

6. The high-electron mobility transistor according to claim 5, wherein the plurality of curved surfaces is in direct contact with the passivation layer.

7. The high-electron mobility transistor according to claim 1, wherein the field plate is in direct contact with the gate.

8. A method for forming a high-electron mobility transistor, comprising:
   providing a substrate;
   forming a buffer layer on the substrate;
   forming a AlGaN layer on the buffer layer;
   forming a passivation layer on the AlGaN layer;
   forming a source layer and a drain layer on the AlGaN layer within a source region and a drain region, respectively;
   forming a gate on the AlGaN layer between the source region and a drain region; and
   forming a field plate on the gate and the passivation layer, wherein the field plate comprises an extension portion that laterally extends to an area between the gate and the drain region, and wherein the extension portion has a wave-shaped bottom surface, wherein the wave-shaped bottom surface is comprised of a plurality of hemispherical features.

9. The method according to claim 8, wherein the plurality of hemispherical features is in direct contact with the passivation layer between the gate and the drain region.

10. The method according to claim 8, wherein the buffer layer comprises GaN layer.

11. The method according to claim 8, wherein the passivation layer comprises silicon nitride or aluminum oxide.

12. The method according to claim 8, wherein the wave-shaped bottom surface comprises a plurality of curved surfaces facing downward to the AlGaN layer.

13. The method according to claim 12, wherein the plurality of curved surfaces is in direct contact with the passivation layer.

14. The method according to claim 8, wherein the field plate is in direct contact with the gate.

* * * * *